(12) United States Patent
Kim (10) Patent No.: US 7,889,534 B2
(45) Date of Patent: Feb. 15, 2011

(54) SEMICONDUCTOR INTEGRATED CIRCUIT FOR SUPPORTING A TEST MODE

(75) Inventor: Taek-Seung Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 147 days.

(21) Appl. No.: 12/327,730

(22) Filed: Dec. 3, 2008

(65) Prior Publication Data

US 2009/0231901 A1    Sep. 17, 2009

(30) Foreign Application Priority Data

Mar. 11, 2008   (KR) ...................... 10-2008-0022587

(51) Int. Cl.
*G11C 7/00*  (2006.01)
(52) U.S. Cl. .................... 365/96; 365/201
(58) Field of Classification Search ............ 365/96, 365/201

See application file for complete search history.

(56) References Cited

U.S. PATENT DOCUMENTS

| 6,690,193 | B1 * | 2/2004 | Heinzer et al. ................. 326/37 |
| 7,085,158 | B2   | 8/2006 | Jeon et al. |
| 2006/0028894 | A1 * | 2/2006 | Brennan et al. .......... 365/225.7 |
| 2008/0158933 | A1   | 7/2008 | Allen et al. |

FOREIGN PATENT DOCUMENTS

| JP | 2007-164971   | 6/2007 |
| KR | 1020070063276 | 6/2007 |

* cited by examiner

*Primary Examiner*—Michael T Tran
(74) *Attorney, Agent, or Firm*—Baker & McKenzie LLP (57) ABSTRACT

A semiconductor integrated circuit for supporting a test mode includes a program region including at least one One Time Programmable Cell Array, and a program region control unit configured to activate the program region in response to an enabled fuse signal of a fuse corresponding to the program region, and to activate the program region in response to a test mode signal of the program region.

23 Claims, 6 Drawing Sheets

SEMICONDUCTOR INTEGRATED CIRCUIT FOR SUPPORTING A TEST MODE

CROSS-REFERENCES TO RELATED APPLICATION

The present application claims priority under 35 U.S.C. 119(a) to Korean application number 10-2008-0022587, filed on Mar. 11, 2008, in the Korean Intellectual Property Office, which is incorporated herein by reference in its entirety as if set forth in full.

BACKGROUND

1. Technical Field

The embodiments described herein relate to a semiconductor integrated circuit, and more particularly, to a semiconductor integrated circuit (IC) for supporting a test mode.

2. Related Art

In general, most semiconductor memory manufacturers are developing Phase change Random Access Memory (PRAM) device that make use of phase changing materials to store data as one of the next generation of memory devices. A PRAM device is a non-volatile memory device that makes use of materials for storing data, such as germanium (Ge), anitmony (Sb), and tellurium (Te) (hereinafter abbreviated as GST), wherein the resistance of the GST material changes as the amorphous/crystalline phases are changed in accordance with changes in temperature of the GST material.

Commonly, semiconductor integrated circuits using non-volatile memory devices, such as PRAM devices include a user's program region, i.e., a One Time Programmable (OTP) region. More specifically, a user is able to store information regarding the device including a serial number of a product, an identification number (ID) of the utilized device, the date of manufacture, and a security number, for example, in the OTP region. Just like a memory region that stores conventional data, the OTP region can include a predetermined memory cell array that is electrically erasable and programmable.

However, when the OTP region is only located in one side of a bank structure, the structure of the entire bank is not symmetric, thereby restricting arrangement of circuits on the semiconductor IC. In addition, a separate OTP decoder is required for providing cell access to the OTP region. Furthermore, if a cell within the OTP region is determined to be faulty, a redundant circuit and a control technique are required to replace the faulty cell with another normal cell in the OTP region.

SUMMARY

A semiconductor integrated circuit capable of supporting a test mode is described herein.

In one aspect, A semiconductor integrated circuit for supporting a test mode includes a program region including at least one One Time Programmable Cell Array, and a program region control unit configured to activate the program region in response to an enabled fuse signal of a fuse corresponding to the program region, and to activate the program region in response to a test mode signal of the program region.

In another aspect, a semiconductor integrated circuit for supporting a test mode includes a plurality of program regions, each including at least one One Time Programmable Cell Array, a fuse unit including a plurality of fuses, each corresponding to one of the plurality of program regions, and a program region control unit configured to determine a program mode operation for one of the plurality of program regions when one of the plurality of fuses corresponding to the one of the plurality of program regions is rendered to a non-conductive state, and to determine initiation of a test mode operation in response to a test mode signal for the one of the plurality of program regions corresponding to the one of the plurality of fuses rendered to the non-conductive state.

In another aspect, a semiconductor integrated circuit for supporting a test mode includes a plurality of banks, each including a memory cell array, a plurality of column decoders configured to select a plurality of bit lines for each of the plurality of banks, a plurality of program regions, each corresponding to one of the plurality of banks and each including at least one One Time Programmable Cell Array, and a program region control unit configured to control activation of a plurality of word lines of the plurality of program regions, wherein during a program mode and a test mode, the plurality of bit lines in the plurality of program regions are selected by the plurality of column decoders and the plurality of word lines are selected by the program region control unit.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
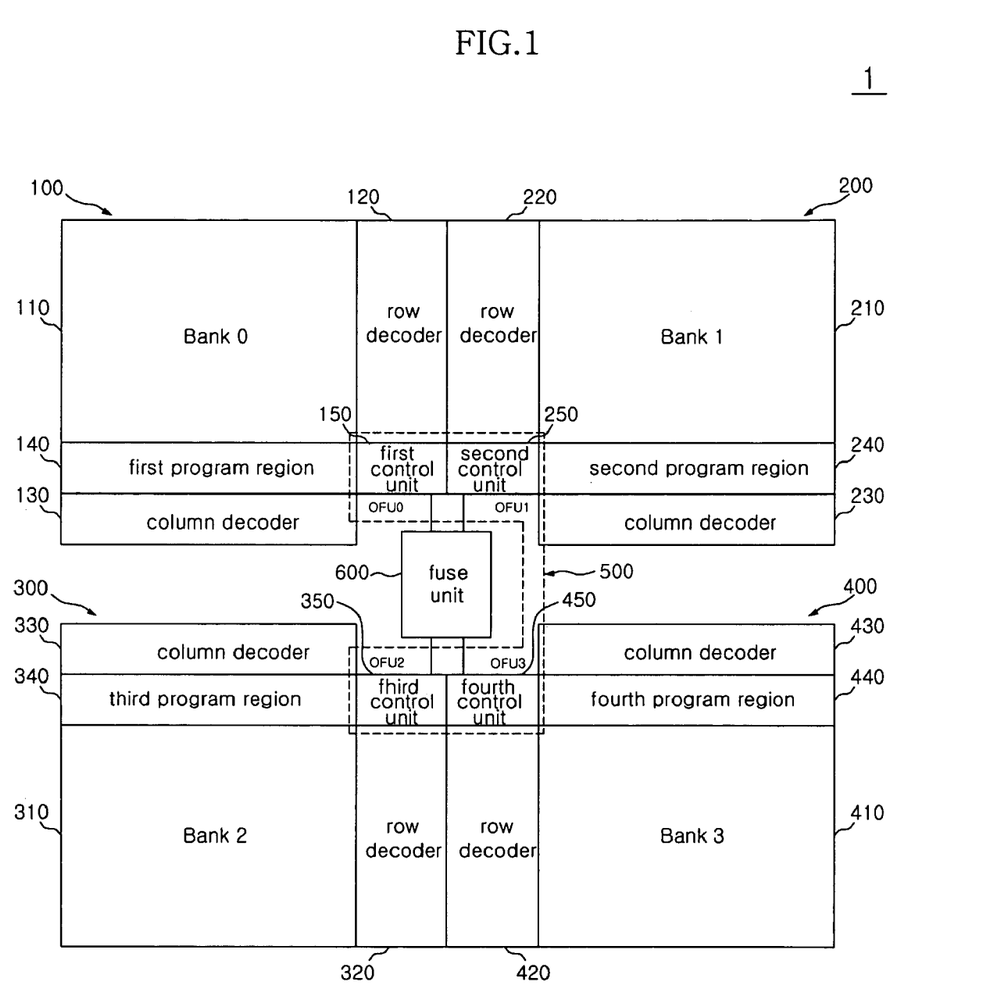
FIG. 1 is a schematic block diagram of an exemplary semiconductor integrated circuit according to one embodiment.

FIG. 1 is a schematic block diagram of an exemplary semiconductor integrated circuit according to one embodiment. Referring to FIG. 1, a semiconductor integrated circuit 1 can be configured to include first to fourth memory regions 100 to 400, a program region control unit 500, and a fuse unit 600. The program region control unit 500 can be configured to include first to fourth control units 150, 250, 350 and 450 located in a corresponding one of the first to fourth memory regions 100 to 400.

The first memory region 100 can include a first bank 110 (Bank 0), a row decoder 120, a column decoder 130, a first program region 140, and a first control unit 150. Similarly, the second memory region 200 includes a second bank 210 (Bank 1), a row decoder 220, a column decoder 230, a second program region 240, and a second control unit 250. Likewise, the third and fourth memory regions 300 and 400 can include banks, row decoders, column decoders, program regions, and control units similar to those of the first and second memory regions 100 and 200. Accordingly, repeated explanations of the second, third, and fourth memory regions 200, 300, and 400 will be omitted for the sake of brevity, and detailed explanation for only the first memory region 100 will be provided.

In FIG. 1, the row decoder 120 can decode the row addresses of the first bank 110, and the column decoder 130 can decode the column addresses of the first bank 110. In addition, the column decoder 130 can decode the column addresses of the first program region 140. For example, the column decoder 130 can be configured to be shared by the first bank 110 and the first program region 140. Thus, since the first bank 110 and the first program region 140 can commonly use the column decoder 130, the requirement for additional space for decoders for both the first bank 110 and the program region 140 can be negated.

The program region 140 includes regions where predetermined codes and numbers can be stored, including a One Time Programmable Cell Array (OTPA). The OTPA can be configured to be substantially identical to the cell structures of the first to fourth banks 110, 210, 310, and 410. For example, the program region 140 can store a user's information in accordance with a program mode and can be used as a test region to perform not only a program mode but a specific test mode, as detailed below.

The first control unit 150 can control whether to activate the first program region 140 in response to a corresponding fuse signal 'OFUO' or in response to a corresponding test mode signal (not shown). The test mode signal can be supplied from one of a mode register set (MRS), an extended mode register set (EMRS), and a special mode register set (SMRS) to activate the first program region 140. Thus, a program mode or a test mode can be performed selectively in each of the first to fourth program regions 140, 240, 340, and 440, according to the control operation of the first to fourth control units 150, 250, 350, and 450, which are located in each of the first to fourth memory regions 100 to 400, respectively. Meanwhile, a plurality of word lines of the first to fourth program regions 140, 240, 340, and 440 can be activated, i.e., word line signal transmitted along the word lines, by the first to fourth control units 150, 250, 350, and 450, respectively. Similarly, a plurality of bit lines of the first to fourth program regions 140, 240, 340, and 440 can be activated, i.e., bit line signals transmitted along the bit lines, by the first to fourth column decoders 130, 230, 330, and 430 of the first to fourth banks 110, 210, 310 and 410, respectively.

In FIG. 1, a fuse unit 600 can be configured to include a plurality of fuses (not shown) that each correspond to at least one of the first to fourth program regions 140, 240, 340, and 440. The fuse unit 600 can function to determine the signal level of each of first to fourth fuse signals 'OFU0' to 'OFU3' depending on whether corresponding fuses are cut, i.e., rendered to a non-conductive state. The first to fourth fuse signals 'OFU0' to 'OFU3' can control the first to fourth control units 150, 250, 350, and 450, respectively.

Since the plurality of program regions 140, 240, 340, and 440 can be substantially located uniformly within each of the first to fourth banks 110, 210, 310, and 410, as shown in FIG. 1, the configuration of circuit arrangement on the semiconductor IC can be simplified. In addition, since other spare program regions on the semiconductor IC can be utilized without separate and complex redundant control units for program regions, control of the IC can be simplified, as detailed below.

Figure 2:
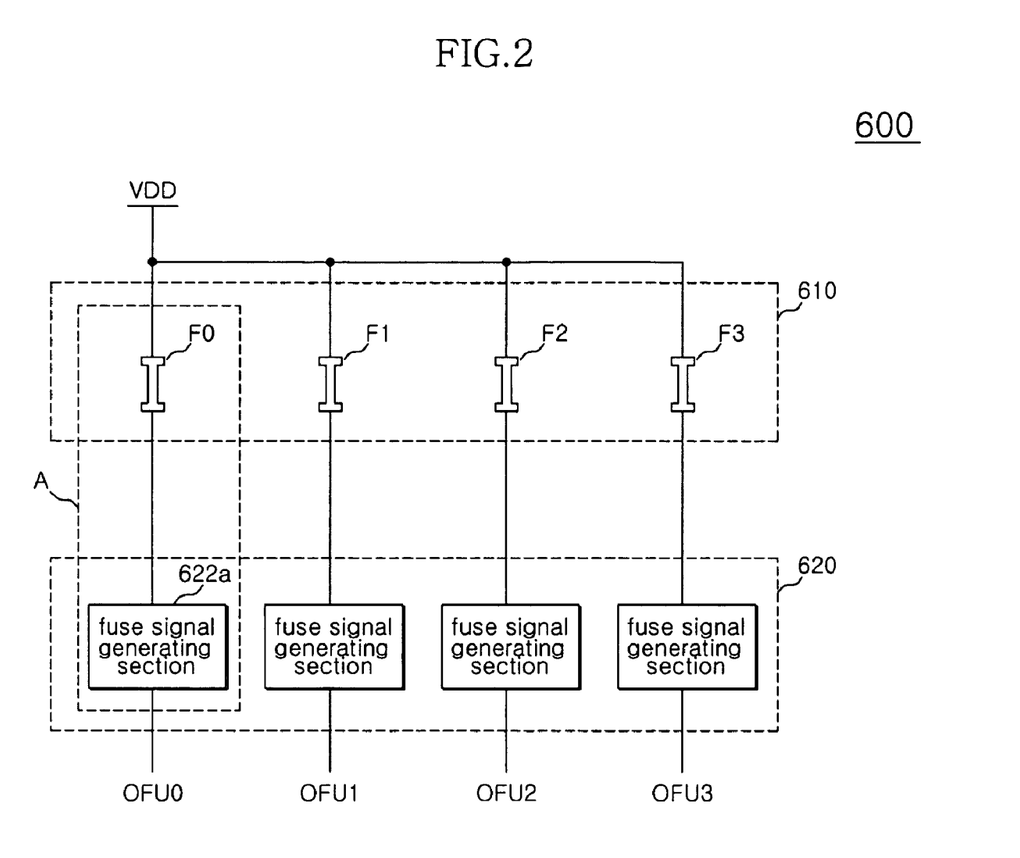
FIG. 2 is a schematic circuit diagram of an exemplary fuse unit of FIG. 1 according to one embodiment.

FIG. 2 is a schematic circuit diagram of an exemplary fuse unit of FIG. 1 according to one embodiment. Referring to FIG. 2, the fuse unit 600 can be configured to include a fuse box 610 and a fuse signal generating section 620. The fuse box 610 can include first to fourth fuses 0FU0 to 0FU3. As described above, each of the first to fourth fuses F0 to F3 can be arranged in correspondence to each of the first to fourth program regions 140, 240, 340, and 440 (in FIG. 1), respectively.

The fuse signal generating section 620 can be connected to the fuse box 610 to provide a plurality of activated fuse signals 'OFU0' to 'OFU3', depending on whether the first to fourth fuses F0 to F3 are rendered to a non-conductive state, or exist in a conductive state. The fuse signal generating section 620 can include a fuse signal generating unit 622a arranged in correspondence to the first to fourth fuses F0 to F3. For example, within a block (A), when the corresponding fuse (here, F0) is rendered to a non-conductive state, the first fuse signal 'OFU0' activated by the fuse signal generating unit 622a connected thereto can be provided.

Figure 3:
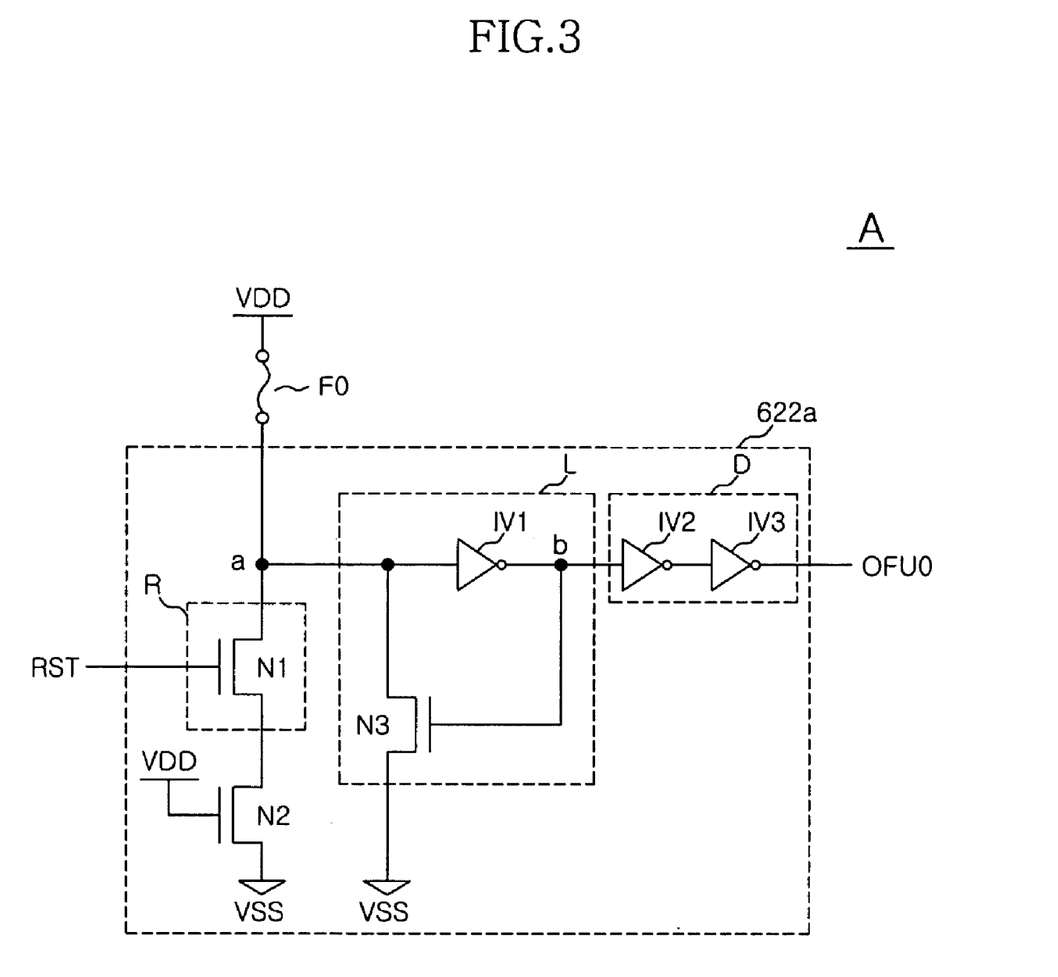
FIG. 3 is a schematic circuit diagram of an exemplary block A of FIG. 2 according to one embodiment.

FIG. 3 is a schematic circuit diagram of an exemplary block A of FIG. 2 according to one embodiment. Referring to FIG. 3, the fuse signal generating unit 622a can be configured to include a reset unit (R), a latch unit (L), and a delay unit (D). For example, the reset unit (R) can receive a reset signal 'RST', and can include a first NMOS transistor N1. The first NMOS transistor N1 can include a gate terminal that receives the reset signal 'RST', a drain terminal that is connected to the node (a), and a source terminal that is connected to a second NMOS transistor N2. The second NMOS transistor N2 can be used to initialize an initial a resetting function. The second NMOS transistor N2 can include a gate terminal that receives an external supply voltage VDD, a drain terminal that is connected to the first NMOS transistor N1, and a source terminal that is connected to a ground voltage VSS. Here, the reset signal 'RST' can be an initializing signal, i.e., a pulse signal that maintains an activated high level during a predetermined time period responding to power-up or reset directions.

The latch unit (L) can latch an inverted level of the node (a), and can be configured to include a first inverter IV1 and a third NMOS transistor N3. The first inverter IV1 can invert the signal of the node (a). The third NMOS transistor N3 can include a gate terminal that receives the signal of the node (a), a drain terminal that is connected to the node (a), and a source terminal that is connected to a ground voltage VSS. In addition, the delay unit (D) can include second and third inverters IV2 and IV3, wherein the second and third inverters IV2 and IV3 can be connected in series to each other.

Hereinafter, operation of the fuse signal generating unit 622a will now be described with reference to FIG. 3. The node (a) can be asserted or transitioned to a high level, unless the first fuse F0 is in a non-conductive state, and the signal of the node (a) can be inverted by the first inverter IV1. Then, the first fuse signal 'OFU0' can be at a low level and can be supplied via the delay unit (D). If the first fuse F0 is in the non-conductive state, the signal of the node (a) can be in a substantially floating state, i.e., non-biased. When the reset signal 'RST' is activated to a high level according to power-up or reset directions, the first and second NMOS transistors N1 and N2 can be turned ON, thereby resulting in a low level of the node (a). Thus, the signal at the node (a) becomes the first fuse signal 'OFU0' at a high level via the latch unit (L) and the delay unit (D). Accordingly, when a fuse applicable to the corresponding program region is rendered to a non-conductive state, a fuse signal at a high level is provided to activate a corresponding one of the program regions.

Figure 4:
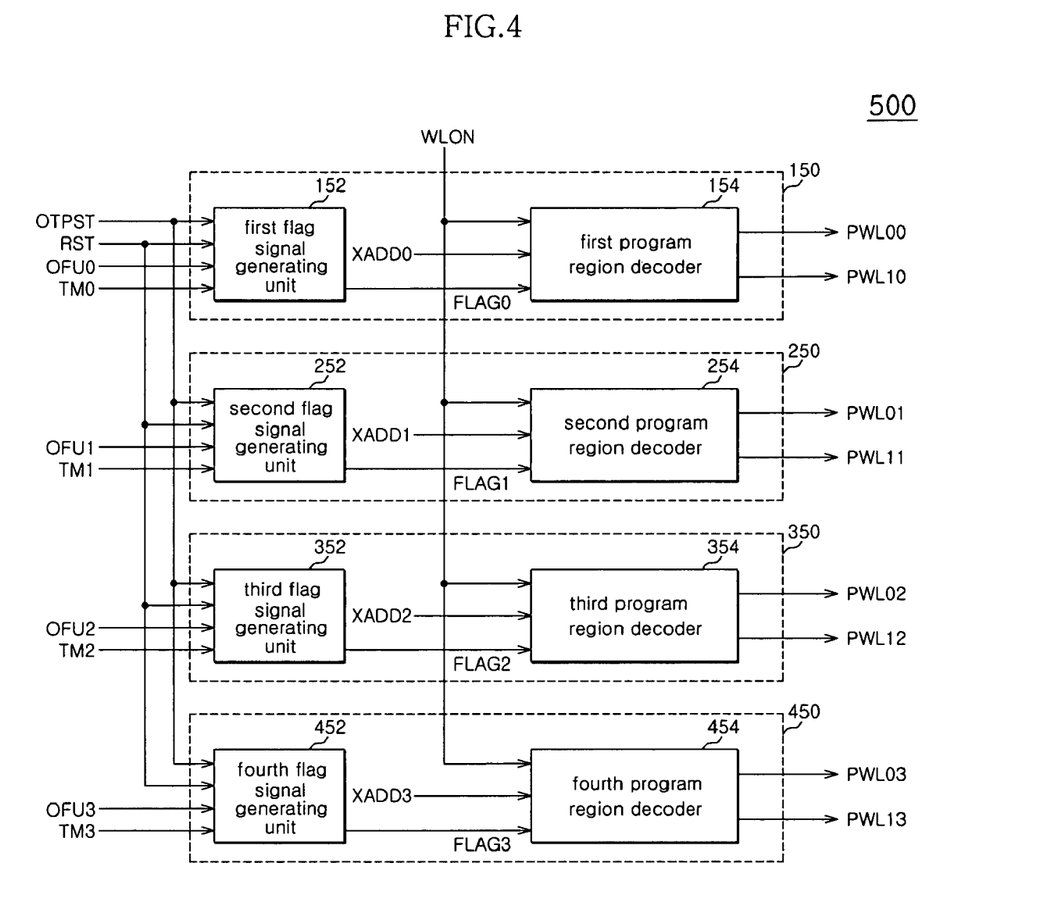
FIG. 4 is a schematic block diagram of an exemplary program region control unit of FIG. 1 according to one embodiment.

FIG. 4 is a schematic block diagram of an exemplary program region control unit of FIG. 1, according to one embodiment. Referring to FIG. 4, the program region control unit 500 can be configured to include the first to fourth control units 150, 250, 350, and 450, wherein each control unit can include first to fourth flag signal generating units 152, 252, 352, and 452, and first to fourth program region decoders 154, 254, 354, and 454, respectively. For the sake of brevity, repeated explanation of each control unit will be omitted, and a detailed explanation for the first control unit 150 will be provided as being representative of the second to fourth control units 250, 350, and 450.

The first control unit 150 can be arranged to include the first flag signal generating unit 152 and the first program region decoder 154. The first program region decoder 154 can provide a first flag signal 'FLAG0' in response to a program mode signal 'OTPST', the reset signal 'RST', the first fuse signal '0FU0', and a first test mode signal 'TM0'. For example, when a program mode is activated, the first flag signal generating unit 152 can provide the activated first flag signal 'FLAG0' in response to the activated first fuse signal '0FU0'. Moreover, the first flag signal generating unit 152 can provide the activated first flag signal 'FLAG0' in response to the activated first test mode signal 'TM0'.

The first program region decoder 154 can decode the received row addresses in response to a word line activating signal 'WLON', a first row address signal 'XADD0', and the first flag signal 'FLAG0'. More specifically, during the time that both the first flag signal 'FLAG0' and the word line activating signal 'WLON' are enabled, the first program region decoder 154 can selectively provide word line signals PWL00 and PWL10 to the first program region (140 in FIG. 1) in response to the received first row address signal 'XADD0'.

Operations for each of the second to fourth control units 250, 350, and 450 can be explained in a similar way, as detailed above. However, each of the second to fourth flag signal generating units 252, 352, and 452 can receive the second to fourth fuse signals '0FU1' to '0FU3' that correspond to each of the second to fourth program regions (240, 340, and 440 in FIG. 1) and the second to fourth test mode signals 'TM1' to 'TM3', respectively. Thus, the second to fourth flag signal generating units 252, 352, and 452 can independently provide the second to fourth flag signals 'FLAG1' to 'FLAG3' in response to separately classified signals.

Although the first to fourth program region decoders 154, 254, 354, and 454 are shown, in FIG. 4, as row decoders for the program regions (140, 240, 340, and 440 in FIG. 1), the first to fourth program region decoders 154, 254, 354, and 454 are not necessarily restricted thereto. However, for purposes of improving space efficiency on the semiconductor IC, it is preferable to share either row decoders or column decoders for program regions with those of corresponding banks. Moreover, although the number of addresses received in each of the decoders shown in FIG. 4 have at least one bit address configuration, the configuration can be adjusted according to the various organization and structure of other devices on the semiconductor IC. Furthermore, the word line activating signal 'WLON' that enables the corresponding word lines of the program regions during a program mode and a test mode is shown to not be provided within a bank region.

Figure 5:
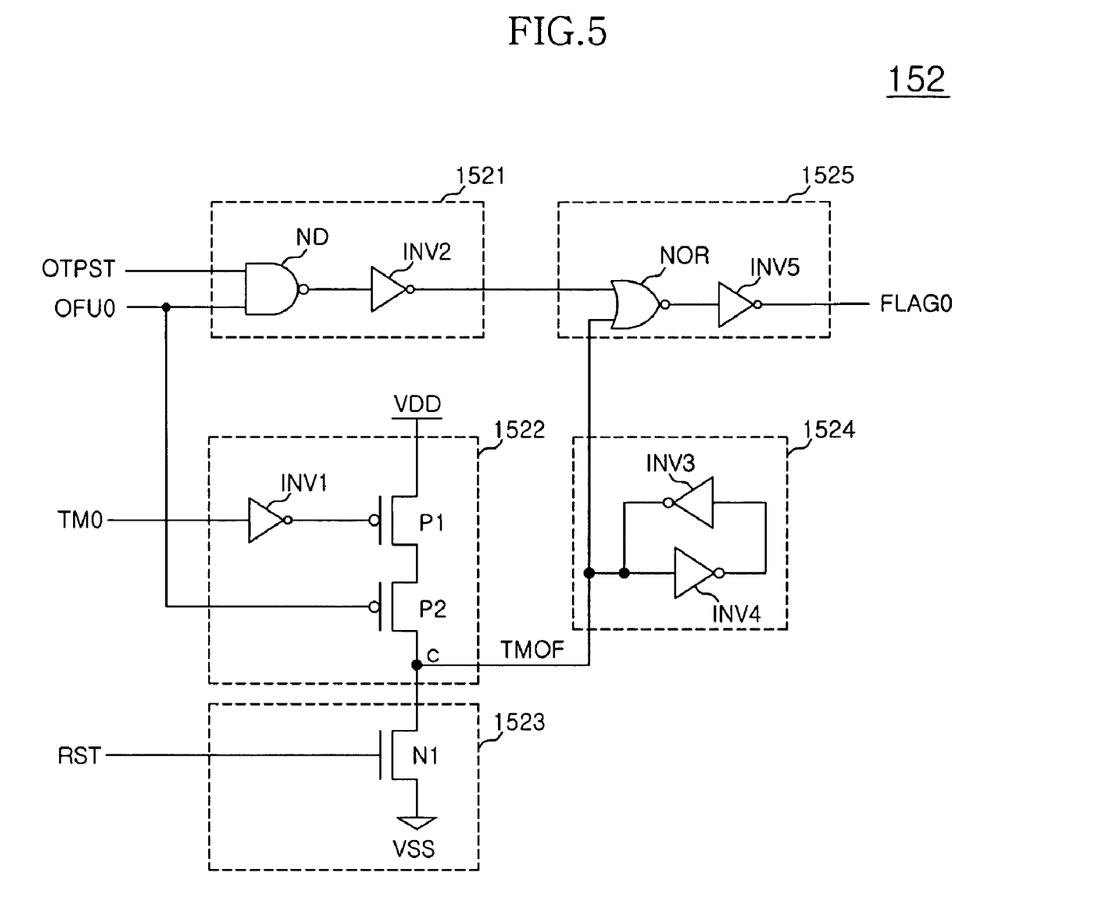
FIG. 5 is a schematic circuit diagram of an exemplary first flag signal generating unit shown of FIG. 4 according to one embodiment.

FIG. 5 is a schematic circuit diagram of an exemplary first flag signal generating unit shown of FIG. 4, according to one embodiment. Referring to FIG. 5, the first flag signal generating unit 152 can be configured to include a program mode signal receiving unit 1521, a test mode signal receiving unit 1522, a reset unit 1523, a latch unit 1524, and a combination unit 1525.

The program mode signal receiving unit 1521 can perform a NAND function for the program mode signal 'OTPST' and the first fuse signal '0FU0'. The program mode signal receiving unit 1521 can include a NAND gate ND and a second inverter INV2. When receiving the program mode signal 'OTPST' and first fuse signal '0FU0', both of which are activated to a high level, the program mode signal receiving unit 1521 can supply an output signal at a high level.

The test mode signal receiving unit 1522 can provide a test mode operation signal 'TMOF' in response to the test mode signal 'TM0' and the first fuse signal '0FU0'. The test mode signal receiving unit 1522 can include first and second PMOS transistors P1 and P2 that can be interconnected in series. For example, the first PMOS transistor P1 can include a gate terminal that receives the inverted signal of the first test mode signal 'TM0', a source terminal that is connected to an external power supply voltage VDD, and a drain terminal that is connected to the second PMOS transistor P2. The second PMOS transistor P2 can include a gate terminal that receives the first fuse signal '0FU0', a source terminal that is connected to the first PMOS transistor P1, and a drain terminal that is connected to a node (c).

The reset unit 1523 can initialize the predetermined node of the first flag signal generating unit 152, and can include a first NMOS transistor N1 having a gate terminal that receives the reset signal 'RST', a drain terminal that is connected to the node (c), and a source terminal that is connected to a ground voltage VSS. When the reset signal 'RST' is activated according to a reset direction, the level of the node (c) can be initialized to a low level.

The latch unit 1524 can latch the signal of the node (c). The latch unit 1524 can be configured to include third and fourth inverters INV3 and INV4 that can be connected in a latch-type arrangement.

The combination unit 1525 can combine the output signal of the program mode signal receiving unit 1521 and the output signal of the test mode signal receiving unit 1522 to provide the first flag signal 'FLAG0'. The combination unit 1525 can include a NOR gate (NOR) and a fifth inverter INV5.

In FIG. 5, the operation of the first flag signal generating unit 152 will be described with respect to a situation where a program mode is activated so that a user can program information into a program region. For purposes of explanation, the node (c) is set to its low level responding to a reset direction before a program mode is activated, and the program mode signal 'OTPST' is activated to a high level.

When the first fuse signal '0FU0' is activated to a high level, the output signal of the second inverter INV2 is transitioned to a high level by the NAND operation of the NAND gate (ND). Thus, the activated first flag signal 'FLAG0' is set to a high level through the NOR gate (NOR), which receives a high level signal, and the fifth inverter INV5 for inverting the high level signal. When the first fuse signal '0FU0' is transitioned to low level, a NAND operation is performed by the NAND gate (ND). Accordingly, the output signal of the second inverter INV2 is transitioned to a low level.

If the first test mode signal 'TM0' is transitioned to a low level, the first PMOS transistor P1 can be turned OFF. Accordingly, one receiving terminal of the NOR gate (NOR) can receive a low level signal from the second inverter INV2, and the other receiving terminal thereof can receive a latched low level signal from the node (c). Thus, through NOR operation of the NOR gate (NOR) and inverting operation of the fifth inverter INV5, the first flag signal 'FLAG0' provide an inactivated signal at a low level.

However, when the first test mode signal 'TM0' is activated, the first PMOS transistor P1 can be turned ON. When the first fuse signal '0FU0' is at a low level, the second PMOS transistor P2 can be also be turned ON. Thus, the node (c) can be transitioned to a high level. Since one receiving terminal of the NOR gate (NOR) can receive a high level signal, the first flag signal 'FLAG0' can be transitioned to a high level through NOR operation and inverting operation of the fifth inverter INV5.

In the one embodiment, the first flag signal 'FLAG0' can be activated depending on whether the fuse of a corresponding program region is in a non-conductive state. Moreover, even if the fuse of the corresponding program region is in a conductive state, the first flag signal 'FLAG0' can be activated by a test mode signal. For example, if the fuse of a corresponding program region is rendered to a non-conductive state, a test mode can be performed for this program region. Furthermore, a spare program region located outside of the corresponding program region can be used later as a redundant region to substitute for faulty program regions. Accordingly, since is the program region can be simply replaced without the necessity of a redundant control unit of a separate circuit, control over the semiconductor IC can be improved.

Figure 6:
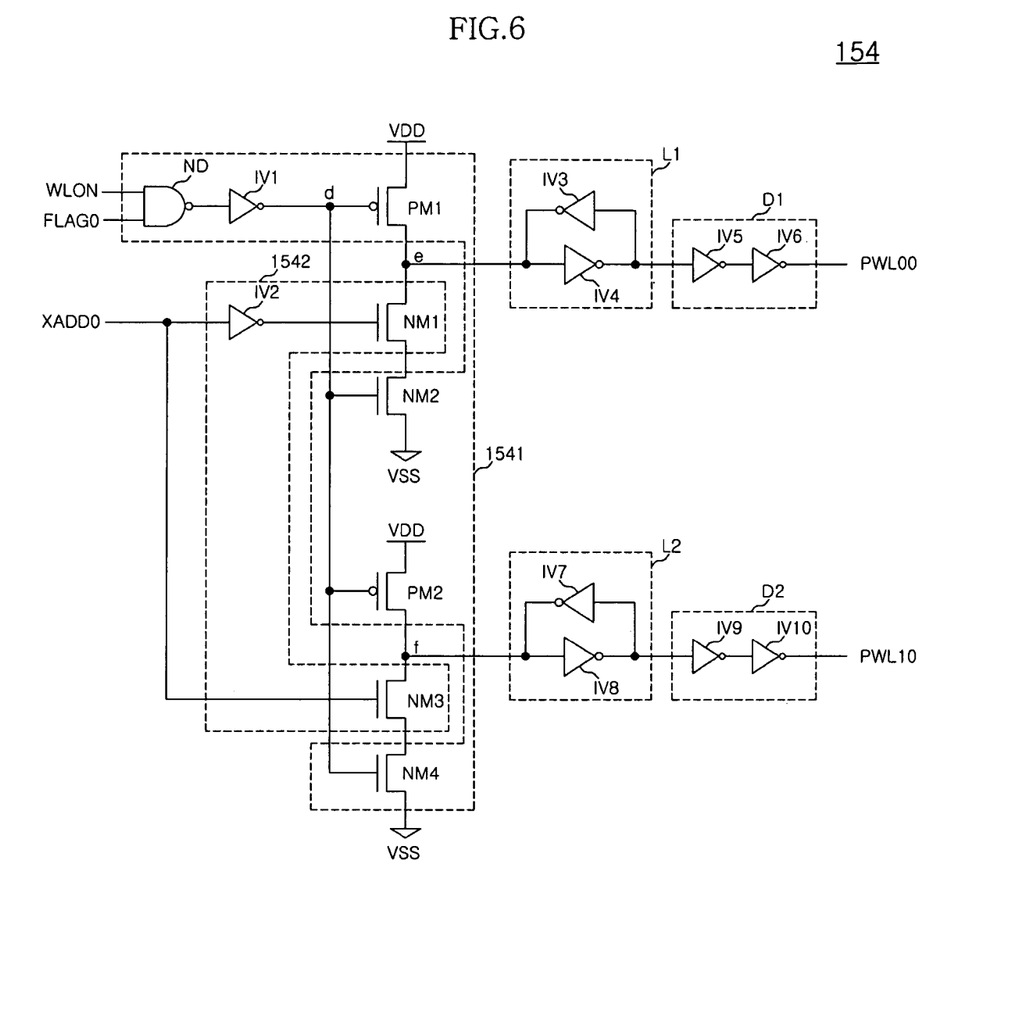
FIG. 6 is a schematic circuit diagram of an exemplary first program region decoder of FIG. 5 according to one embodiment.

FIG. 6 is a schematic circuit diagram of an exemplary first program region decoder of FIG. 5 according to one embodiment.

Referring to FIG. 6, the first program region decoder 154 can be configured to include a flag signal receiving unit 1541, an address receiving unit 1542, first and second latch units L1 and L2, and first and second delay units D1 and D2.

The flag signal receiving unit 1541 can provide a signal transmission path for an address signal or an external power supply voltage VDD in response to the first flag signal 'FLAG0' and the word line activating signal 'WLON'. The flag signal receiving unit 1541 can be arranged to include a NAND gate (ND), a first inverter IN1, first and second PMOS transistors PM1 and PM2, and second and fourth NMOS transistors NM2 and NM4.

The NAND gate (ND) can receive both the first flag signal 'FLAG0' and the word line activating signal 'WLON' as input. The first PMOS transistor PM1 can include a gate terminal that receives the signal of a node (d), a source terminal that is connected to an external power supply voltage VDD, and a drain terminal that is connected to a node (e). The second NMOS transistor NM2 can include a gate terminal that receives a signal of the node (d), a drain terminal that is connected to the first NMOS transistor NM1, and a source terminal that is connected to a ground voltage VSS. The second PMOS transistor PM2 can include a gate terminal that receives the signal of the node (d), a source terminal that is connected to an external power supply voltage VDD, and a drain terminal that is connected to a node (f). The fourth NMOS transistor NM4 can include a gate terminal that receives the signal of the node (d), a drain terminal that is connected to the third NMOS transistor NM3, and a source terminal that is connected to a ground voltage VSS.

When the word line activating signal 'WLON' is activated and the first flag signal 'FLAG0' is activated, the flag signal receiving unit 1541 can provide a signal transmission path for an address signal so that selected word line signals can be controlled for decoding. However, when either the word line activating signal 'WLON' or the first flag signal 'FLAG0' is inactivated, the flag signal receiving unit 1541 can block off the signal transmission path for the address signal so that it provides the signal transmission path for an external power supply voltage VDD, and thus, provides all of the word lines at an inactivated level.

The address receiving unit 1542 can receive the first row address signal 'XADD0' as an input, and can be configured to include a second inverter IV2, a first NMOS transistor NM1, and a third NMOS transistor NM3. The first NMOS transistor NM1 can include a gate terminal that receives the inverted first row address signal 'XADD0', a drain terminal that is connected to the node (e), and a source terminal that is connected to the second NMOS transistor NM2. The third NMOS transistor NM3 can include a gate terminal that receives the first row address signal 'XADD0', a drain terminal that is connected to the node (f), and a source terminal that is connected to the fourth NMOS transistor NM4. Accordingly, since either of the first or the third NMOS transistor NM1 or NM3 can be selectively turned ON according to the level of the first row address signal 'XADD0', the address receiving unit 1542 can supply different signal transmission paths for the first row address signal 'XADD0'.

The first and second latch units L1 and L2 can latch the level of the node (e) and the node (f), respectively, and can include third and fourth inverters IV3 and IV4 connected in a latch-type arrangement. The second larch unit L2 can include seventh and eighth inverters IV7 and IV8 connected in a latch-type arrangement.

The first and second delay units D1 and D2 can delay the output signals of the first and second latch units L1 and L2 for a predetermined time period, and can provide first and second word line signals 'PWL00' and 'PWL10' to the first program region (140 in FIG. 1), respectively. The first delay unit D1 can include fifth and sixth inverters IV5 and IV6, and the second delay unit D2 can include ninth and tenth inverters IV9 and IV10.

An exemplary operation of the first program region decoder 154 will be described. Here, the word line activating signal 'WLON' can activate word lines for a program region when in a program mode or in a test mode. When in a program mode, explanation will be provided when both the word line activating signal 'WLON' and the first flag signal 'FLAG0' are activated.

Both of the NAND gate ND terminals can receive activated signals at a high level, wherein the node (d) is transitioned to a high level. Accordingly, the first and second PMOS transistors PM1 and PM2 are turned OFF to block off a signal transmission path for an external power supply voltage VDD. Thus, the second and fourth NMOS transistors NM2 and NM4 are turned ON to provide a signal transmission path for the first row address signal 'XADD0'. For example, a signal transmission path through the node (e) or the node (f) can be selectively supplied according to the level of the first row address signal 'XADD0'.

When the first row address signal XADD0 is at a low level, the first NMOS transistor NM1 can be turned ON to provide a signal transmission path via the node (e). The first and second NMOS transistors NM1 and NM2 are turned ON, and the node (e) is transitioned to a low level. Then, through the first latch unit L1 and the first delay latch unit D1, the first word line signal 'PWL00' of the first program region (140 in FIG. 1) can be supplied at a high level.

However, when the first row address signal 'XADD0' is at a high level, the third NMOS transistor NM3 can be turned ON to provide a signal transmission path via the node (f). The third and fourth NMOS transistors NM3 and NM4 are turned ON, and the node (f) is lowered to a low level. Then, through the second latch unit L2 and the second delay latch unit D2, the second word line signal 'PWL10' of the first program region (140 in FIG. 1) can be supplied at a high level.

Next, an exemplary operation will be described when the first flag signal 'FLAG0' is inactivated. Here, either the fuse of a corresponding program region is not rendered to a non-conductive state in spite of a program mode, or a test mode is inactivated.

Since one receiving terminal of the NAND gate (ND) receives a low level as an input, the node (d) transitions to a low level by NAND operation. Thus, the first and second PMOS transistors PM1 and PM2 can be turned ON, and the node (e) and the node (f) can transition to be an external power supply voltage VDD. Thus, both the first and second word line signals 'PWL00' and 'PWL10' of the first program region (140 in FIG. 1) can be inactivated irrespective of the level of the received first row address signal 'XADD0'.

According to the exemplary embodiment, a plurality of program regions (140, 240, 340, and 440 in FIG. 1) can be controlled by first to fourth control units (150, 250, 350, and 450), respectively. Since the program regions (140, 240, 340, and 440 in FIG. 1) can be uniformly located in each of a plurality of banks, arrangement design of the program regions can be simplified. In addition, since the plurality of program regions are arranged as such, spare user program regions can be provided. Moreover, the program regions can be used as redundant regions substitutable for faulty program regions, and as regions for performing a test mode to verify operation properties of a semiconductor IC.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit for supporting a test mode, comprising:
a program region including at least one One Time Programmable Cell Array; and
a program region control unit configured to activate the program region in response to an enabled fuse signal of a fuse corresponding to the program region, and to activate the program region in response to a test mode signal of the program region,
wherein the integrated circuit provides an activated flag signal due to the test mode signal irrespective of a level of the enabled fuse signal when the program region is activated in response to the test mode signal.

2. The semiconductor integrated circuit of claim 1, wherein the integrated circuit activates a plurality of word lines of the program region by decoding a plurality of row addresses in response to the activated flag signal.

3. A semiconductor integrated circuit for supporting a test mode, comprising:
a program region including at least one One Time Programmable Cell Array; and
a program region control unit configured to activate the program region in response to an enabled fuse signal of a fuse corresponding to the program region, and to activate the program region in response to a test mode signal of the program region,
wherein a program mode of the program region is activated to provide the activated flag signal when the program region responds to the enabled fuse signal.

4. The semiconductor integrated circuit of claim 3, wherein the enabled fuse signal is activated when the fuse corresponding to the program region is rendered to a non-conductive state.

5. The semiconductor integrated circuit of claim 3, wherein the integrated circuit activates a plurality of word lines of the program region by decoding a plurality of row addresses in response to the activated flag signal.

6. A semiconductor integrated circuit for supporting a test mode, comprising:
a plurality of program regions, each including at least one One Time Programmable Cell Array;
a fuse unit including a plurality of fuses, each corresponding to one of the plurality of program regions; and
a program region control unit configured to determine a program mode operation for one of the plurality of program regions when one of the plurality of fuses corresponding to the one of the plurality of program regions is rendered to a non-conductive state, and to determine initiation of a test mode operation in response to a test mode signal for the one of the plurality of program regions corresponding to the one of the plurality of fuses on conductive state.

7. The semiconductor integrated circuit of claim 6, wherein the program region control unit includes a plurality of control units, each corresponding to one of the plurality of program regions.

8. The semiconductor integrated circuit of claim 7, wherein each of the control units includes:
a flag signal generating unit configured to provide a flag signal depending on whether one of the plurality of fuses is rendered to the non-conductive state, or to respond to the test mode signal that corresponds to the one of the plurality of program regions corresponding to the one of the plurality of fuses on conductive state; and
a program region decoder selectively providing a plurality of word line signals by decoding a plurality of row addresses in response to the flag signal.

9. The semiconductor integrated circuit of claim 8, wherein the flag signal generating unit provides the activated flag signal when the one of the plurality of fuses is rendered to the non-conductive state.

10. The semiconductor integrated circuit of claim 8, wherein the flag signal generating unit provides an activated flag signal, independent of whether the one of the plurality of fuses is rendered to the non-conductive state, by activation of the test mode signal.

11. The semiconductor integrated circuit of claim 8, wherein the program region decoder produces the plurality of word line signals by decoding the plurality of row addresses when the flag signal is activated.

12. The semiconductor integrated circuit of claim 6, wherein the fuse unit includes:
a fuse box including the plurality of the fuses;
a fuse signal generating section connected to the fuse box, and providing a plurality of activated fuse signals corresponding to each of the plurality of program regions when the fuse box is rendered to a non-conductive state.

13. The semiconductor integrated circuit of claim 12, wherein the fuse signal generating section includes a plurality of fuse signal generating units, each connected to corresponding ones of each of the plurality fuses.

14. The semiconductor integrated circuit of claim 13, wherein the fuse signal generating unit provides the fuse signal at an activated level when the fuse is rendered to the non-conductive state, and provides the fuse signal at an inactivated level when the fuse is not rendered to the non-conductive state.

15. The semiconductor integrated circuit of claim 6, wherein the test mode signal is supplied from one of a mode register set, an extended mode registry set, and a special mode register set to activate each of the plurality of program regions.

16. A semiconductor integrated circuit for supporting a test mode, comprising:
- a plurality of banks, each including a memory cell array;
- a plurality of column decoders configured to select a plurality of bit lines for each of the plurality of banks;
- a plurality of program regions, each corresponding to one of the plurality of banks and each including at least one One Time Programmable Cell Array; and
- a program region control unit configured to control activation of a plurality of word lines of the plurality of program regions,
- wherein during a program mode and a test mode, the plurality of bit lines in the plurality of program regions are selected by the plurality of column decoders and the plurality of word lines are selected by the program region control unit, and
- wherein the program region control unit includes a plurality of control units, each corresponding to one of the plurality of program regions.

17. The semiconductor integrated circuit of claim 16, wherein each of the control units includes:
- a flag signal generating unit providing a flag signal dependent upon whether a fuse is rendered to a non-conductive state or in response to a test mode signal that corresponds to one of the plurality of program regions;
- a program region decoder configured to selectively provide word line signals for a corresponding one of the plurality of program regions in response to the flag signal by decoding a plurality of row addresses.

18. The semiconductor integrated circuit of claim 17, wherein the flag signal generating unit provides the flag signal when the corresponding fuse is rendered to the non-conductive state.

19. The semiconductor integrated circuit of claim 17, wherein the flag signal generating unit provides the flag signal due to the test mode signal, independently of whether the fuse is rendered to the non-conductive state.

20. The semiconductor integrated circuit of claim 17, wherein the program region decoder decodes the plurality of row addresses and activate corresponding ones of the plurality of word lines when the flag signal is activated.

21. A semiconductor integrated circuit for supporting a test mode, comprising:
- a fuse unit;
- a plurality of banks, each including a memory cell array;
- a plurality of column decoders configured to select a plurality of bit lines for each of the plurality of banks;
- a plurality of program regions, each corresponding to one of the plurality of banks and each including at least one One Time Programmable Cell Array; and
- a program region control unit configured to control activation of a plurality of word lines of the plurality of program regions,
- wherein during a program mode and a test mode, the plurality of bit lines in the plurality of program regions are selected by the plurality of column decoders and the plurality of word lines are selected by the program region control unit, and
- wherein the fuse unit includes:
  - a fuse box including a plurality of the fuses, each corresponding to one of the plurality of program regions; and
  - a fuse signal generating section connected to the fuse box to provide a plurality of fuse signals, each corresponding to one of the plurality of program regions, when the fuse is rendered to the non-conductive state.

22. The semiconductor integrated circuit of claim 21, wherein the fuse signal generating section includes each of the plurality of fuse signal generating units connected to the plurality of fuses.

23. The semiconductor integrated circuit of claim 22, wherein the integrated circuit provides the fuse signal at an activated level when the fuse is rendered to the non-conductive state, and provides the fuse signal at an inactivated level when the fuse is not rendered to the non-conductive state.

* * * * *